United States Patent
Karayil Thekkoott et al.

(10) Patent No.: US 9,632,181 B2
(45) Date of Patent: Apr. 25, 2017

(54) SYSTEM, METHOD AND APPARATUS FOR RADIO FREQUENCY BASED LOCATION AND TRACKING

(71) Applicant: Loka Wireless Sdn. Bhd., Petaling Jaya, Selangor (MY)

(72) Inventors: Narayanan Manoj Karayil Thekkoott, Kuala Lumpur (MY); Anila Manoj, Kuala Lumpur (MY)

(73) Assignee: Loka Wireless Sdn. Bhd., Petaling Jaya (MY)

( * ) Notice: Subject to any disclaimer, the term of this patent is extended or adjusted under 35 U.S.C. 154(b) by 923 days.

(21) Appl. No.: 13/893,581

(22) Filed: May 14, 2013

(65) Prior Publication Data

US 2014/0043186 A1    Feb. 13, 2014

Related U.S. Application Data

(60) Provisional application No. 61/682,258, filed on Aug. 12, 2012.

(51) Int. Cl.

| | |
|---|---|
| G01S 19/03 | (2010.01) |
| G01S 3/04 | (2006.01) |
| G01S 19/17 | (2010.01) |
| G01S 5/00 | (2006.01) |
| B63C 9/20 | (2006.01) |
| H03M 1/28 | (2006.01) |
| G08B 21/02 | (2006.01) |
| G08B 25/01 | (2006.01) |
| G08B 25/10 | (2006.01) |
| B63C 9/00 | (2006.01) |

(52) U.S. Cl.
CPC .............. *G01S 19/03* (2013.01); *B63C 9/20* (2013.01); *G01S 3/04* (2013.01); *G01S 3/046* (2013.01); *G01S 5/0009* (2013.01); *G01S 5/0027* (2013.01); *G01S 19/17* (2013.01); *G08B 21/0269* (2013.01); *G08B 21/0272* (2013.01); *G08B 25/016* (2013.01); *G08B 25/10* (2013.01); *H03M 1/28* (2013.01); *B63C 2009/0017* (2013.01)

(58) Field of Classification Search
USPC ...... 342/108, 112, 129, 357.25, 357.31, 378, 342/386; 340/993
See application file for complete search history.

(56) References Cited

U.S. PATENT DOCUMENTS

| | | |
|---|---|---|
| 2,413,300 A | 12/1946 | Dunn et al. |
| 7,606,567 B1 | 10/2009 | Katz |

OTHER PUBLICATIONS

International Search Report mailed Dec. 17, 2013 for PCT/IB2013/001606 (3 pgs.).
Written Opinion of the International Search Authority mailed Dec. 17, 2013 for PCT/IB2013/001606 (11 pgs.).

*Primary Examiner* — Dao Phan
(74) *Attorney, Agent, or Firm* — Maier & Maier, PLLC

(57) ABSTRACT

A method for wirelessly transmitting geographic coordinate information and a system and apparatus implementing the method. The method may include obtaining a latitude coordinate and a longitude coordinate, correlating a first radio frequency to the latitude coordinate, correlating a second radio frequency to the longitude coordinate, transmitting a signal at the first radio frequency, and transmitting a signal at the second radio frequency.

10 Claims, 8 Drawing Sheets

SYSTEM, METHOD AND APPARATUS FOR RADIO FREQUENCY BASED LOCATION AND TRACKING

CROSS-REFERENCE TO RELATED APPLICATIONS

This application claims priority to U.S. Provisional Application 61/682,258, filed Aug. 12, 2012 and entitled "A Locating and tracking System which Assign unique frequencies to every location on the Earth and use the assigned frequencies to communicate the location and other information", the entire contents of which are hereby incorporated by reference.

BACKGROUND

Systems which provide location and tracking information have become increasingly significant in modern life. A class of services in this field that is becoming increasingly prevalent is known as Location Based Services. Among these, systems that provide location awareness and tracking of personnel or assets are gaining increasing importance. Such systems are meant to transmit location information of personnel or assets, and to subsequently track the movement of personnel or assets for various applications. A majority of such systems utilize either GPS or terrestrial or satellite signal based receivers to determine the exact of the person or asset. The systems then use either existing cellular infrastructure such as GSM or GPRS, broadband wireless systems such as WiFi or WiMAX, or other wireless techniques to wirelessly transmit the determined location to an interested party.

Location information is of paramount importance in a Safety of Life event. The availability of precise location information enables search and rescue personnel to quickly reach the desired location and then to efficiently conduct rescue operations. Such precise location information is extremely important, for example, in rescue at sea operations, where multiple targets are dispersed over a large body of water, and where the likelihood of survival is significantly dependent on the elapsed time between the catastrophic event and the rescue of the survivors.

Known systems for Safety of Life at Sea procedures operate in specific frequency channels within the HF, VHF and UHF bands. Emergency Position Indicating Radio Beacons (EPIRB), VHF Radios, HF radios and various other systems are used for sending and receiving distress signals in the event that assets or personnel are in distress. Additionally, beacons signals operating in VHF frequencies are used to aid the rescue team in accurately homing on to and locating the survivors.

One of the drawbacks of the known systems is that the number of simultaneous users is limited, due to the narrow frequency spectrum available for use by the system. As a result, in situations having a large number of persons in distress, co-channel interference may occur, wherein the signals from each user will interfere with each other due to all the signals occupying the same frequency band. The known systems do not provide any sort of time, frequency, or any other type of multiplexing, which is necessary when multiple users are using the same spectrum. Due to the narrow spectrum and to the lack of multiplexing, the known Safety of Life at Sea systems are ineffective in situations having a large number of survivors dispersed over an area.

For example, in a situation where an airliner is forced to make a water landing, or a catastrophic event on a drilling rig, several hundred people may be dispersed in the water surrounding the ditch site. In the event of a marine vessel accident, the number of people to be rescued may be in the thousands. In such situations, the Emergency Location Transmitter (ELT) may be able to transmit information as to the location of the incident to the rescue team. However, by the time the rescue personnel arrive, the survivors may have drifted and become scattered across a large area. Rescue of the survivors depends firstly on locating the persons who might have drifted long distance from the crash or evacuation site. An electronic tracking and homing system which is attached to each individual, for example to the individual's the life jacket or personal floating device (PFD) can be of significant help in the locating survivors.

However, in the situations highlighted above, and in similar situations where a large number of survivors need to be located simultaneously, the existing Safety of Life systems are not satisfactory for locating and tracking a large number of personnel. Accordingly, there is a need for a location and tracking system that is able to locate and track a large number of individuals simultaneously in the area of a catastrophic event.

SUMMARY

According to at least one exemplary embodiment, a method for wirelessly transmitting geographic coordinate information is disclosed. The method may include obtaining a latitude coordinate and a longitude coordinate, correlating a first radio frequency to the latitude coordinate, correlating a second radio frequency to the longitude coordinate, transmitting a signal at the first radio frequency, and transmitting a signal at the second radio frequency. The method may also include upconverting the first radio frequency to a third radio frequency, upconverting the second radio frequency to a fourth radio frequency, transmitting a signal at the third radio frequency, and transmitting a signal at the fourth radio frequency.

According to another exemplary embodiment, a system for radio frequency based location and tracking is disclosed. The system can include at least one first communications device adapted to transmit signals at radio frequencies correlated to the geographical coordinates of the at least one first communications device, and a second communications device adapted to communicate with the at least one first communications device so as to cause the at least one first communications device to transmit the signals.

According to another exemplary embodiment, an apparatus for radio frequency based location and tracking is disclosed. The apparatus can include a processor, a GPS receiver, and a transceiver, wherein the processor is adapted to receive geographical coordinates of the apparatus from the GPS receiver, correlate radio frequencies to the geographical coordinates, and cause the transceiver to transmit signals at the radio frequencies.

BRIEF DESCRIPTION OF THE FIGURES

Advantages of embodiments of the present invention will be apparent from the following detailed description of the exemplary embodiments. The following detailed description should be considered in conjunction with the accompanying figures in which.

DETAILED DESCRIPTION

Figure 1A:
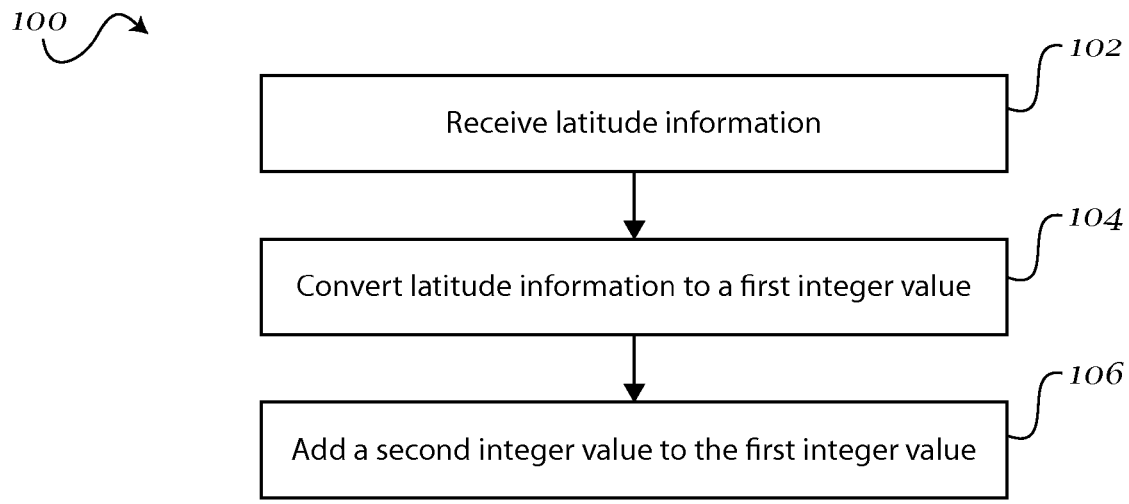
FIGS. 1a-1c show exemplary methods for converting geographic coordinate information to unique frequencies.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

Further, many of the embodiments described herein are described in terms of sequences of actions to be performed by, for example, elements of a computing device. It should be recognized by those skilled in the art that the various sequences of actions described herein can be performed by specific circuits (e.g. application specific integrated circuits (ASICs)) and/or by program instructions executed by at least one processor. Additionally, the sequence of actions described herein can be embodied entirely within any form of non-transitory computer-readable storage medium such that execution of the sequence of actions enables the at least one processor to perform the functionality described herein. Furthermore, the sequence of actions described herein can be embodied in a combination of hardware and software. Thus, the various aspects of the present invention may be embodied in a number of different forms, all of which have been contemplated to be within the scope of the claimed subject matter. In addition, for each of the embodiments described herein, the corresponding form of any such embodiment may be described herein as, for example, "a computer configured to" perform the described action.

The embodiments disclosed herein teach a system, method and apparatus for location-specific wireless communications that can be used in any location on the planet. This is facilitated by the conversion of the geographical position information of a particular location to a set of uniquely identifiable frequencies, which are then subsequently used to establish a wireless link to the particular location. Unique frequencies may be assigned to the latitude, longitude and elevation of a communications device according to the embodiments disclosed herein. By using the frequencies that are related to elevation and geographical coordinates, every communication between the transmitter and receiver can inherently provide the location of origin of the communication. In some exemplary embodiments, a local information and service provider network, utilizing the embodiments disclosed herein, can be established to efficiently provide location-based information and service. The network may be adapted to offer community networking, community messaging, Safety of Life & Disaster Response, Location-based advertising, Local Search and various other applications.

At least one of the exemplary embodiments herein discloses a tracking system that is able locate and track a large number, for example thousands, of simultaneous individual users. The system can convert latitude and longitude information for each individual user into a unique frequency and can then utilize such unique frequencies to transmit information such as beacon signals, position information, and any other desired information by any suitable modulation or encoding technique via the unique frequency. As each individual user may be located at unique latitude, longitude, and elevation coordinates, each individual user may have a unique set of frequencies for transmitting and receiving information. Therefore, the embodiments disclosed herein can solve the problem of frequency multiplexing, as each individual user is automatically assigned a set of unique frequencies depending on their position. Frequency multiplexing resulting from spatial separation can mitigate the problem of signals of diverse users interfering with each other and can enable the system to simultaneously locate a large number of individual users.

So as to simultaneously locate and track a large number of individual users, a wide bandwidth may be necessary. The embodiments disclosed herein may operate within the industrial, scientific and medical (ISM) frequency band in the range of 2,400 to 2,500 MHz, thus providing a bandwidth of 100 MHz. Such a wideband spectrum can be able to accommodate simultaneous operation of 1 million or more users at any time, provided that the channel bandwidth for each individual user is limited to 100 Hz. Such a low channel bandwidth can be achieved by using Slow Speed Morse Coding as the encoding used for transmitting the location or other information between the user and a central receiving station.

FIG. 1a shows an exemplary method 100 of converting latitude information to a unique frequency. At step 102, latitude information may be received. The latitude information may be received from any source and by any manner of transmission, including, but not limited to, a GPS device. The latitude information may be received in or converted to a decimal format, such that the latitude information is represented by a 7-digit number having two integer and five decimal positions. Additionally, the latitude information can include information indicating that the latitude is located north or south of the equator.

At step 104, the 7-digit latitude information may be converted to an integer value, for example, by multiplying the 7-digit latitude information by 10,000 resulting in a 7-digit latitude integer. At step 106, a predetermined second integer may be to the latitude integer. The second integer may be, for example, 10,000,000 or 20,000,000, wherein a leading digit of 1 can represent a latitude north of the equator, and a leading digit of 2 can represent a latitude south of the equator. The resulting eight-digit sum value can then represent a frequency, in Hz, corresponding to the particular latitude. Two ranges of frequencies may thus be obtained: a range of 10.000000 MHz to 18.999999 MHz, corresponding to a latitude range of 0 to 89.99999 N; and a range of 20.000000 MHz to 28.999999 MHz, corresponding to a latitude range of 0 to 89.99999 S.

Figure 1B:
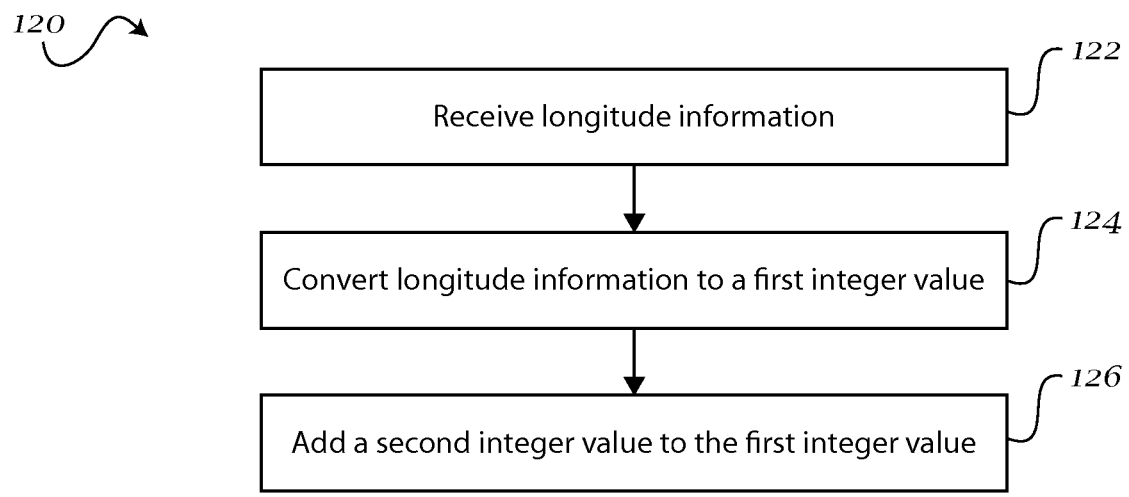

FIG. 1b shows an exemplary method 120 of converting latitude information to a unique frequency. At step 122, longitude information may be received. The longitude information may be received from any source and by any manner of transmission, including, but not limited to, a GPS device. The longitude information may be received in or converted to a decimal format, such that the longitude information is represented by an 8-digit number having three integer and five decimal positions. Additionally, the longitude information can include information indicating that the longitude is located east or west of the prime meridian.

At step 124, the 8-digit longitude number may converted to an integer value, for example, by multiplying the 8-digit longitude number by 10,000 so as to obtain an 8-digit longitude integer. At step 126, a predetermined second integer may be to the longitude integer. The second integer may be, for example, 300,000,000 or 400,000,000, wherein a leading digit of 3 can represent a latitude east of the prime meridian, and a leading digit of 4 can represent a latitude west of the prime meridian. The resulting nine-digit sum value can then represent a frequency, in Hz, corresponding to the particular longitude. Two ranges of frequencies may thus be obtained: a range of 300.000000 MHz to 317.999999 MHz, corresponding to a latitude range of 0 to 179.99999 E; and a range of 400.000000 MHz to 417.999999 MHz, corresponding to a latitude range of 0 to 179.99999 W.

Figure 1C:
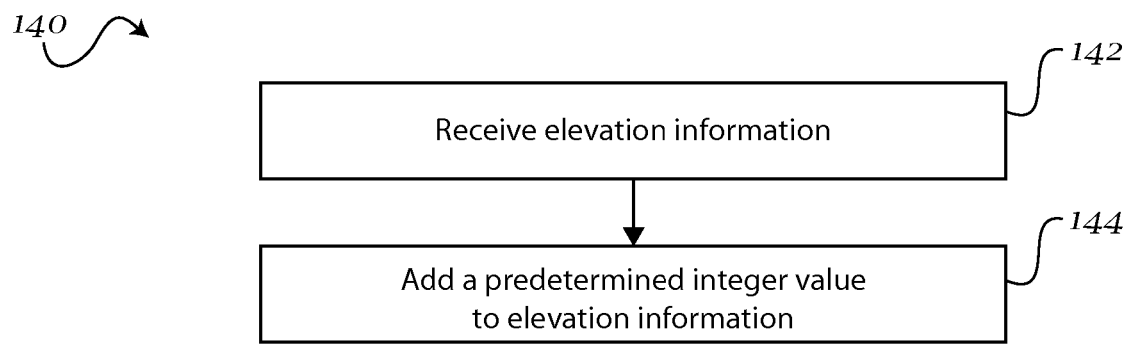

FIG. 1c shows an exemplary method 140 of converting elevation information to a unique frequency. At step 142, elevation information may be received. The elevation information may be received from any source and by any manner of transmission, including, but not limited to, a GPS device. The elevation information may be received in a decimal format, with the elevation value corresponding to an actual elevation in the range between 9,999 meters below sea level and 9,899,999 meters above sea level.

At step 124, an integer value of 10,000 may be added to the elevation value so as to obtain a value in the range between 10,001 and 9,999,999. The resulting nine-digit integer value can then be represent a frequency, in the range between 10.001 kHz to 9.999999 mHz, corresponding to the particular elevation.

It should be appreciated that the specific details of the above-described numerical values and mathematical operations are merely exemplary and not limiting. It should also be appreciated that methods 100, 110, and 120 may be implemented utilizing diverse numerical values, mathematical operations, and frequency values without departing from the spirit of the invention. Furthermore, it should be understood that the above-described methods may be implemented by any suitable analog or digital machine or apparatus, as well as any computing device, or computer program product, wherein the above-described methods may be provided as computer-readable program code, executable by a processor and storable on a computer-readable medium.

Figure 2:
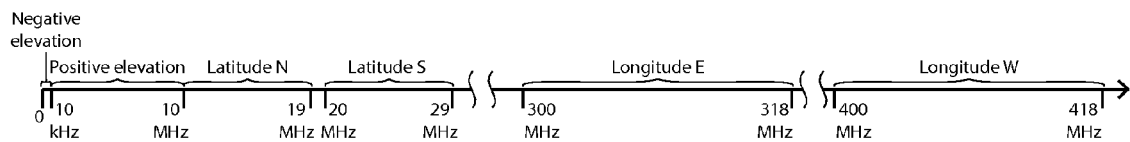
FIG. 2 shows an exemplary radio frequency spectrum corresponding to geographic coordinate information.

Exemplary unique frequency mappings for latitude, longitude, and elevation are shown in Table 1, below, as well as in FIG. 2.

TABLE 1

| Geographic Coordinate | Coordinate Range | Frequency Range |
| --- | --- | --- |
| Latitude values between Equator and North Pole | 0-89.9999 N | 10,000,000 Hz-18,999,999 Hz or 10 MHz-18.999999 MHz |
| Latitude values between Equator and South Pole | 0-89.9999 S | 20,000,000 Hz-28,999,999 Hz or 20 MHz-28.999999 MHz |
| Longitude values east of Prime Meridian to antimeridian | 0-179.9999 E | 300,000,000 Hz-317,999,999 Hz or 300 MHz-317.999999 MHz |
| Longitude values west of Prime Meridian to antimeridian | 0-179.9999 W | 400,000,000 Hz-417,999,999 Hz or 400 MHz-417.999999 MHz |
| Elevation values below sea level | −9,999 m-0 m | 0-9.999 KHz |
| Elevation values above sea level | 0 m-9,899,999 m | 10.001 kHz-9,999.999 kHz |

For wireless communication purposes, for example when communications via the VHF, UHF or microwave bands are desired, the unique frequency spectrum may be upconverted to a suitable frequency band that allows such communication. In such cases, the unique frequency spectrum may be narrowed in consideration of the intended geographical area of coverage. For example, if an embodiment of the system disclosed herein is intended for operation within the area of the contiguous United States, the corresponding approximate longitude range is between 67° W and 124° W, while the corresponding approximate latitude range is between 24° N and 49° N.

Figure 3:
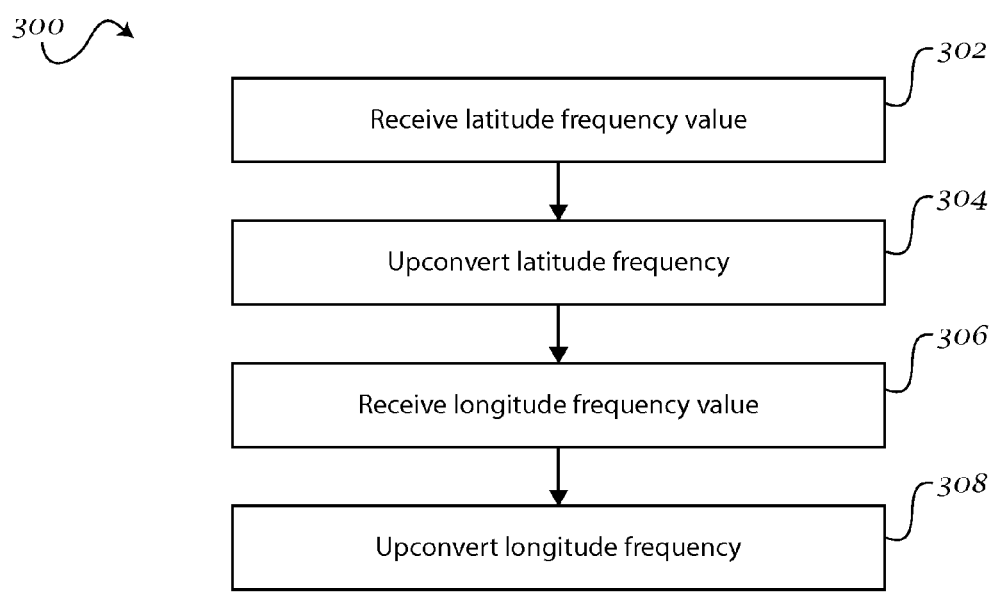
FIG. 3 shows an exemplary method for upconverting frequencies corresponding to geographic coordinate information.

FIG. 3 shows an exemplary method 300 for upconverting the unique frequency spectrum into the 2.4 GHz-2.5 GHz ISM band, utilizing only latitude and longitude values for the contiguous United States. At step 302, latitude frequencies within the approximate range of 12.4 MHz to 14.9 MHz, corresponding to latitudes within the approximate range of 24° N to 49° N, may be received. At step 304, the latitude frequencies may be upconverted to a higher frequency band within the approximate range of 2412.4 MHz to 2414.9 MHz. The upconversion may be performed, for example, by way of a quadrature upconverter, while the frequency band for upconversion may be selected by a local oscillator, which may be set, in this exemplary embodiment, to a frequency of 2400 MHz.

Similarly, at step 306, longitude frequencies within the approximate range of 406.7 MHz to 412.4 MHz, corresponding to longitudes within the approximate range of 67° W to 124° W, may be received. At step 308, the longitude frequencies may be upconverted to a higher frequency band within the approximate range of 2426.7 MHz to 2432.4 MHz. The upconversion may be performed, for example, by way of a quadrature upconverter, while the frequency band for upconversion may be selected by a local oscillator, which may be set, in this exemplary embodiment, to a frequency of 2020 MHz.

Figure 4:
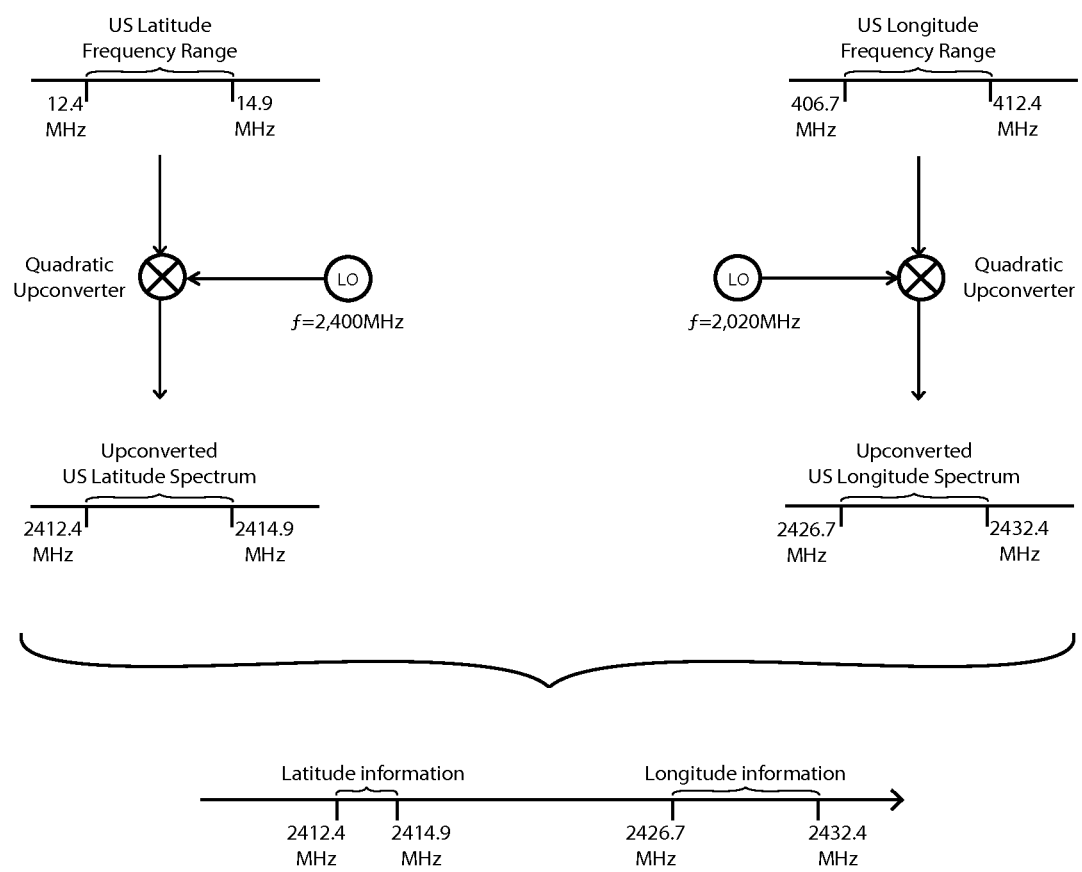
FIG. 4 shows exemplary frequency spectra and upconverted frequency spectra for the United States.

The upconverted frequency mappings for latitude, longitude in the exemplary embodiment for the contiguous United States, and elevation are shown in Table 2, below, as well as in FIG. 4.

TABLE 2

| Approximate Geographic Coordinate | Initial Approximate Frequency Range | Approximate Upconverted Frequency Range | Approximate Bandwidth |
|---|---|---|---|
| Latitude values between 24° N and 49° N | 12.4 MHz to 14.9 MHz | 2412.4 MHz to 2414.9 MHz | 2.5 MHz |
| Longitude values between 67° W and 124° W | 406.7 MHz to 412.4 MHz | 2426.7 MHz to 2432.4 MHz | 47 MHz |

As a result, any and every geographical location in the contiguous United States may be mapped within the limited spectrum of the 2.4 GHz-2.5 GHz ISM band. The above upconverted frequency sets may thus be used to communicate location-specific information to any location within the United States. However, it should be appreciated that embodiments of method 300 may be adapted for any geographical area and any desired frequency band simply by selecting a set of unique coordinate frequencies from methods 100 and 120 that correspond to the desired geographical area, and by using a local oscillator set to a frequency that can result in the unique coordinate frequencies being upconverted to the desired frequency band.

Figure 5A:
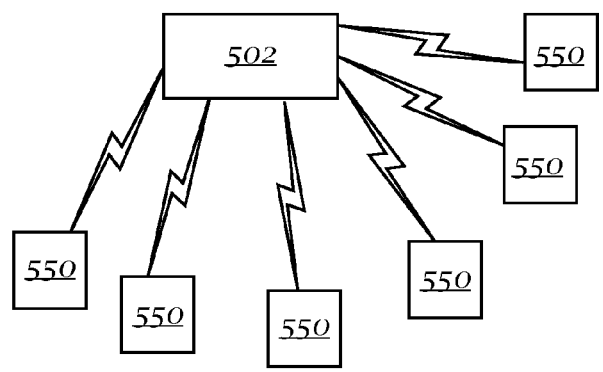
FIG. 5a shows an exemplary system for radio-frequency based location and tracking.
Figure 5B:
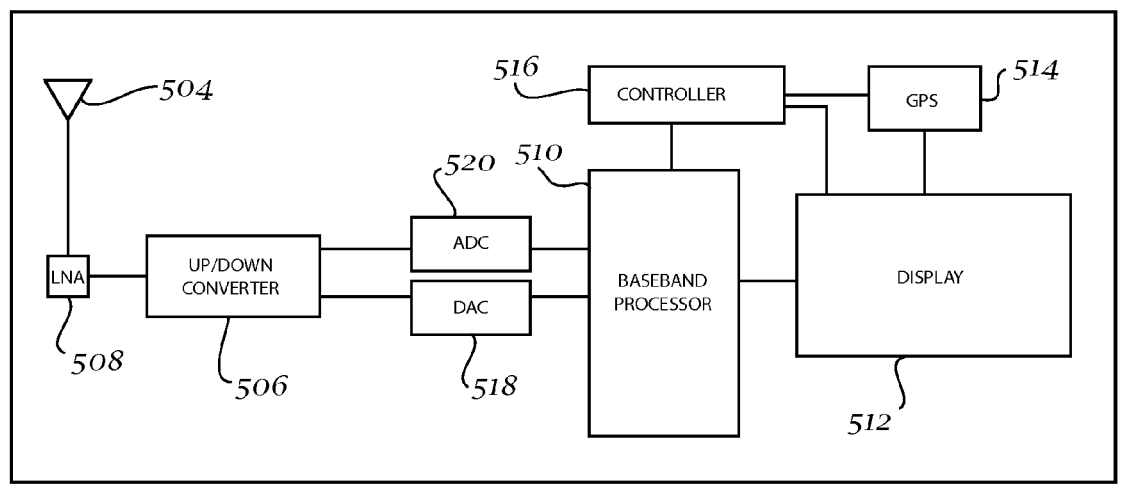
FIG. 5b shows an exemplary base station of a system for radio-frequency based location and tracking.
Figure 5C:
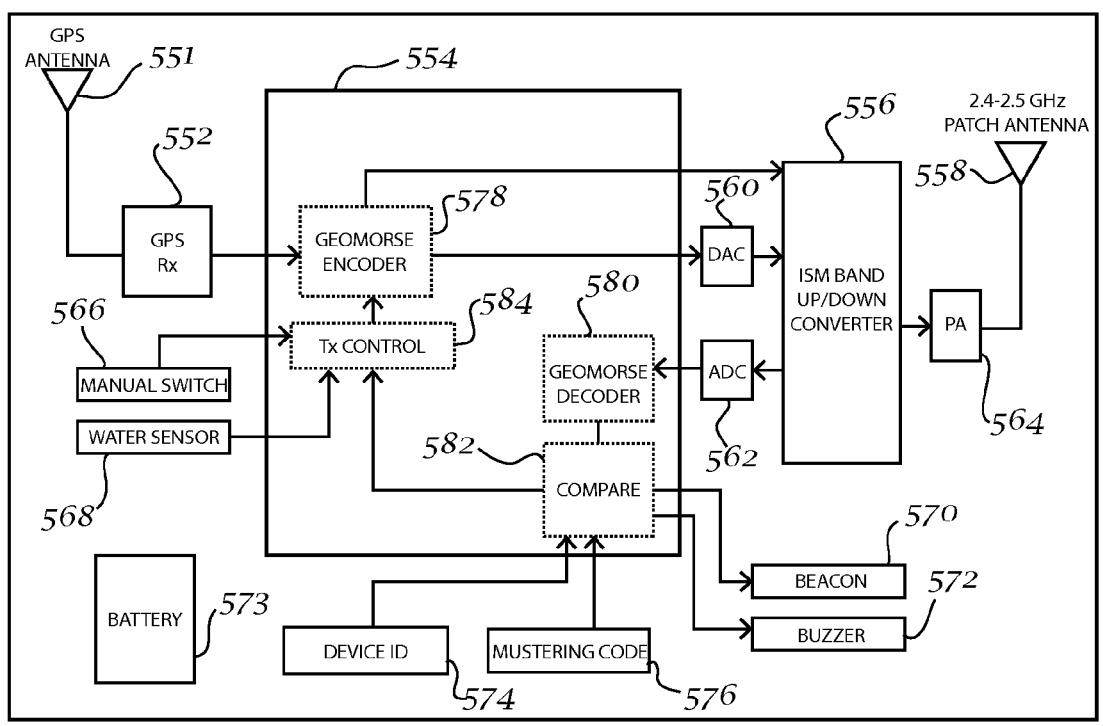
FIG. 5c shows an exemplary remote transceiving tag of a system for radio-frequency based location and tracking.

Turning now to FIGS. 5a-5c, exemplary embodiments of systems and apparatuses implementing the herein-disclosed embodiments of coordinate frequency mapping methods are disclosed. The systems and apparatuses may facilitate tracking of assets or personnel, and may be suited both for land-based and sea-based operations.

FIG. 5a shows an exemplary system 500 for radio frequency based location and tracking. In one exemplary embodiment, system 500 may be adapted to operate in the 2.4 GHz-2.5 GHz ISM band. The system 500 can include a central transceiving base station 502 communicatively coupled to a plurality of individual remote transceiving tags 550.

The base station 502 may be adapted to transmit communications to and receive communications from all desired remote transceiving tags 550 in a desired area. The remote transceivers 504, in turn, may be adapted to transmit beacon signals and Morse-coded signals, and to receive Morse-coded signals from the base station 502. As Morse-coded signals are slow speed, low bandwidth, and offer high signal-to-noise ratio, the use of Morse-coded signals can allow for coverage distance to be extended. Consequently the remote transceiving tags 550 may use Morse code to modulate the transmitted radio signal, so as to substantially maximize transmission distance. In some exemplary embodiments, the transmitted power output of each remote transceiving tag 550 may be under 1 W or 30 dBm; however, tags having any desired transmitted power output that enables system 500 to function as described herein may be used.

FIG. 5b shows an exemplary embodiment of a base station 502. The base station 502 can include an RF antenna 504 coupled to an RF up/down converter 506. In some exemplary embodiments, a low noise amplifier 508 may be provided between antenna 504 and converter 506. Converter 506 can in turn be communicatively coupled to a baseband processor 510. In some exemplary embodiments, RF up/down converter 506 may be coupled to baseband processor 510 via a digital-to-analog converter 518 and an analog-to-digital converter 520. The baseband processor 510 may be communicatively coupled to a display device 512, which in turn may be communicatively coupled to a GPS device 514. In some exemplary embodiments, a microcontroller 516 may be communicatively coupled to display device 512, GPS device 514, baseband processor 510, as well as any other components of base station 502. The microcontroller may be any known computing or logic device that enables base station 502 to function as described herein may be used, for example a field-programmable gate array, digital signal processor, complex programmable logic device, microprocessor, or any other suitable logic circuit.

Signals received by base station 502 from tags 550 may be decoded to the from the upconverted frequencies to the baseband frequencies. Suitable signal processing may be performed on the resulting signals so as to retrieve latitude, longitude, and any other information received from the tags 550. The retrieved information may then be displayed on display device 512, for example on a map showing the positions of a desired number of tags 550.

Base station 502 may also be adapted to initiate communications to a plurality of tags 550 in a desired area. Such communications can include, for example, ping operations and mustering operations. The base station 502 can communicate with tags 550 on unused frequencies in the particular frequency spectrum that is being used. For example in the 2.4-2.5 GHz ISM band, such unused frequencies may be in the approximate ranges of 2,419 MHz to 2,420 MHz and 2,429 MHz to 2,430 MHz. Tags 550, in turn, may be configured to monitor such frequencies for a signal from base station 502. As described in further detail below, if a tag 550 receives a signal on the monitored frequency, tag 550 can determine whether the signal exceeds a predetermined received signal strength indication (RSSI) threshold. If the signal exceeds the RSSI threshold, the tag 550 can determine, for example by performing a Fast Fourier Transform (FFT), the presence of a base station transmission signal. If so, tag 550 can then decode the received signal and retrieve the data contained therein.

The data contained in signals sent from the base station 502 to tags 550 can include a plurality of information. The transmission may include the following information, which may be sent in the following order: a pilot sequence, an operation identifier, a device ID or mustering code, up to 256 bytes of additional data, and a checksum value. The operation identifier may be a two-bit value indicating the type of communication requested or sent by the base station, for example, a ping operation, a muster operation, a text communication, or, in some exemplary embodiments, an audio communication, which may be a voice over machine-to-machine communication. The ping and mustering operations, as well as the device ID and mustering code are discussed in further detail below.

FIG. 5c shows an exemplary embodiment of a remote transceiving tag 550. Each remote transceiving tag 550 can include a GPS antenna 551 and GPS receiver 552, communicatively coupled to a microcontroller 554. Alternatively, any known computing or logic device that enables transceiving tag 550 to function as described herein may be used, for example a field-programmable gate array, digital signal processor, complex programmable logic device, microprocessor, or any other suitable logic circuit. The microcontroller 554 can further be communicatively coupled to an ISM band up/down converter 556, and an ISM band transceiver antenna 558. In some exemplary embodiments, the microcontroller 554 may be coupled to converter 556 via a digital-to-analog converter 560 and an analog-to-digital converter 562. A power amplifier 564 may also be provided between converter 556 and transceiver 558. Each remote tag 550 may further include a power source such as a battery 573 for providing power to the various components thereof.

Microcontroller 554 may further be operatively coupled to a user-operable transmit switch 566, a water sensor 568, a light-emitting device such as a beacon 570, and a sound-emitting device such as a buzzer 572.

Each remote tag 550 may have a unique device ID 574, which may be a 10-digit numeric string. The device ID 574 may be a permanent ID and may be stored in the hardware, or any other non-transitory computer-readable medium of the tag 550. Each remote tag 550 may also have a mustering code 576, which may be a 4-digit numeric string. The mustering code 576 may likewise be stored in hardware, or any other non-transitory computer-readable medium of the tag 550. The mustering code 576 may be common to a desired group of remote tags 550.

The microcontroller 554 may be adapted to execute a plurality of functions, such as, but not limited to, the following. The microcontroller 554 may include "geomorse encoding" function 578, wherein GPS data obtained from GPS receiver 552 may be mapped to corresponding frequency values, and to transmit signals on those frequencies using Morse coding. The geomorse encoding function 578 may implement any or all of the methods 100, 110, and 120, that are described herein.

In one exemplary embodiment, latitude and longitude coordinate data received from GPS receiver 552 may be mapped to unique frequency values $f_{lat}$ and $f_{lon}$. The $f_{lat}$ and $f_{lon}$ frequencies may then be used to communicate the GPS information as beacons and using Morse coding. The output of geomorse encoding function 578 may be sent to ISM band transceiver 558, via ISM band up/down converter 556, which may implement the method 300 described herein. The original $f_{lat}$ and $f_{lon}$ frequencies may be upconverted into the 2.4-2.5 GHZ ISM band by converter 556, and then transmitted by transceiver 558.

The microcontroller 554 may further include a "geomorse decoding" function 580, wherein a Morse-coded broadcast received from a base station 502 may be decoded to obtain data therein. As described above, the obtained data may include, but is not limited to, a pilot sequence, an operation identifier, a numerical string containing a device ID or a mustering code, additional data, and a checksum value. A portion of the obtained data may then be compared, by a comparison function 582, to any other desired data, for example to the device ID 574 and mustering code 576.

Microcontroller 554 may further include a transmission control function 584, wherein the operating modes of tag 550 may be selected and changed based on any number of desired criteria, as discussed further below.

Figure 6:
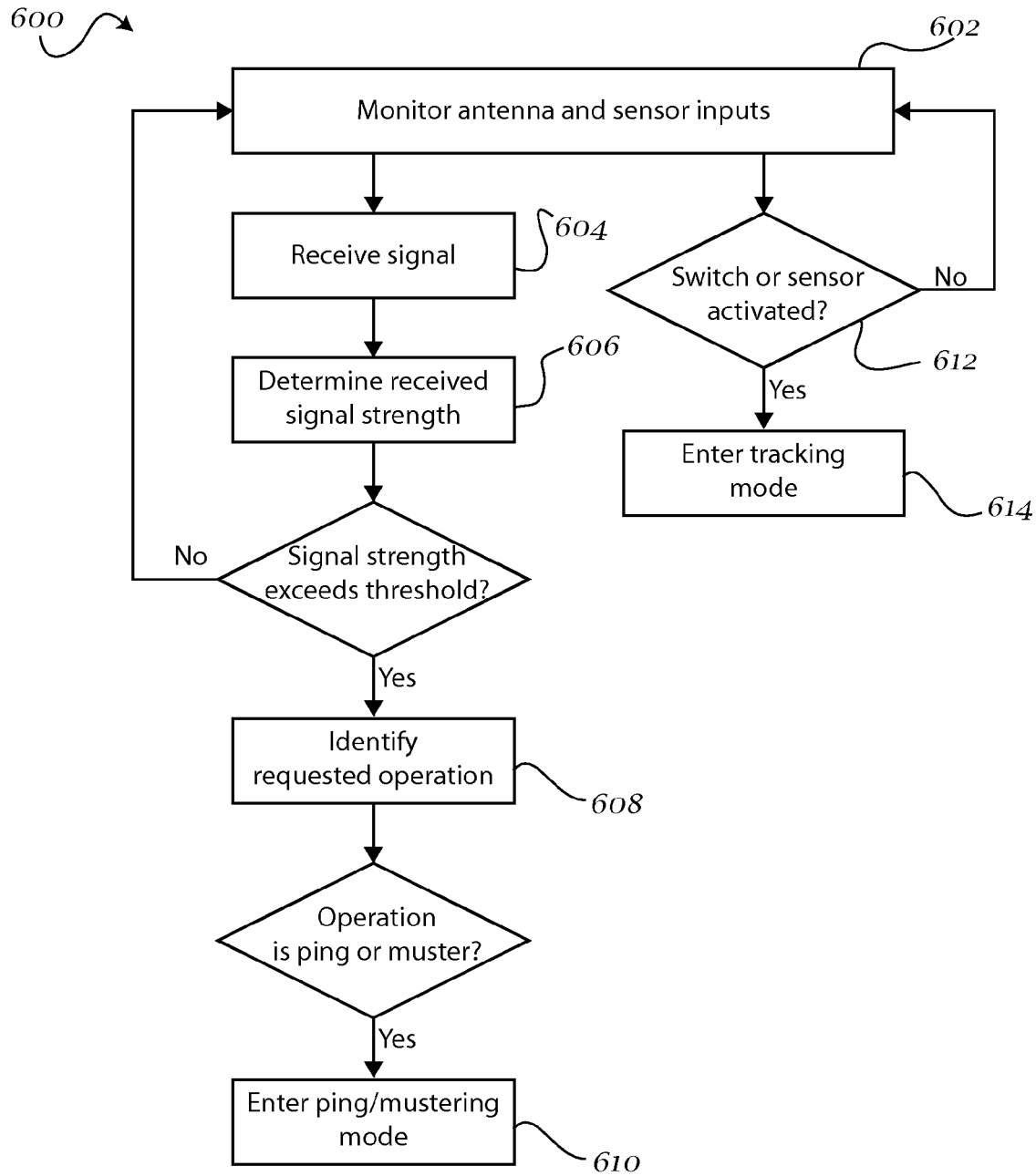
FIG. 6 shows an exemplary method for switching remote tag operational modes.

Remote transceiving tag 550 may be operable in a plurality of operating modes, including a standby mode, a tracking mode, and a ping/mustering mode. FIG. 6 illustrates an exemplary method 600 of selecting an operating mode for remote transceiver 550.

At step 602, tag 550 may enter the standby mode. The standby mode may be entered automatically after tag 550 is powered up. In the standby mode, the tag may receive and monitor inputs from a plurality of sources, including ISM band transceiver 554, user-operable transmit switch 566, and water sensor 568. The ISM band transceiver 554 may be configured to monitor frequencies that are not being used for transmissions originating from tags 550 in the particular frequency spectrum that is being used. For example, in the 2.4-2.5 GHz ISM band, such unused frequencies may be in the approximate ranges of 2,419 MHz to 2,420 MHz and 2,429 MHz to 2,430 MHz.

At step 604, tag 550 may receive a signal. At step 606, the strength of the signal may be determined. If the signal exceeds a predetermined RSSI threshold, tag 550 may determine the requested operation, for example by decoding at least a portion of the data contained in the signal, such as the operation identifier, at step 608. If the operation identifier indicates a ping or muster operation, enter the ping/mustering mode, at step 610. If the signal does not exceed the RSSI threshold, tag 550 may remain in the standby mode.

Additionally, at step 612, tag 550 may determine whether user-operable transmit switch 566 has been manually activated by the user, or whether water sensor 568 has been activated by contact with water. A user may manually activate switch 566, for example if the user desires to transmit their GPS coordinates to base station 502, while water sensor 568 may be activated, for example, in the case of a man overboard. If switch 566 or sensor 568 has been activated, tag 550 may enter the tracking mode, at step 614. If switch 566 and sensor 568 have not been activated, tag 550 may remain in the standby mode.

Figure 7:
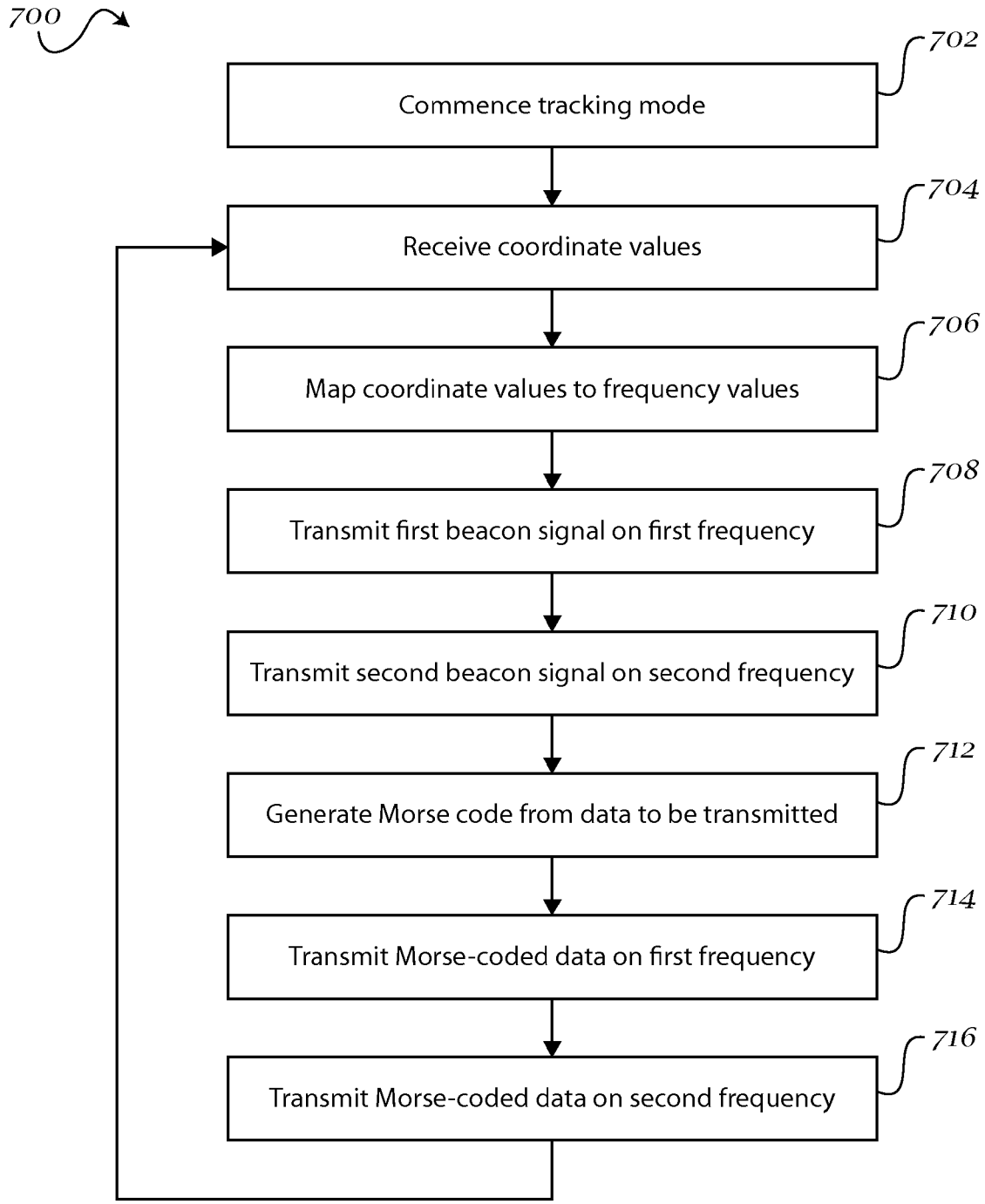
FIG. 7 shows an exemplary tracking mode method for a remote transceiving tag.

FIG. 7 illustrates an exemplary tracking mode method 700. At step 702, tracking mode may be commenced, for example by activation of transmit switch 566 or water sensor 568. At step 704, latitude and longitude values may be received from GPS receiver 552. At step 706, the latitude and longitude values may be mapped to their corresponding frequencies $f_{lat}$ and $f_{lon}$.

Subsequently, at step 708, a first beacon signal may be transmitted. The first beacon signal may be a simple continuous wave sinusoidal signal, and may have a frequency of $f_{lat}$. The frequency of the first beacon signal may be upconverted to the 2.4-2.5 GHZ ISM band for transmission. The duration of the transmission of the first beacon signal may be, for example, about 2.0 seconds; however any other desired duration may also be used.

At step 710, a second beacon signal may be transmitted. The second beacon signal may also be a simple continuous wave sinusoidal signal, and may have a frequency of $f_{lon}$. The frequency of the beacon signal may be upconverted to the 2.4-2.5 GHZ ISM band for transmission. The duration of the transmission of the second beacon signal may be, for example, about 2.0 seconds; however any other desired duration may also be used. Additionally, a delay of about 1.0 seconds may be provided between the transmission of the first and second beacon signal; however, any other desired delay duration may also be used.

At step 712, Morse code may be generated for the data to be transmitted to the base station 502. The data for transmission can include at least the device ID 574 of tag 550. In some exemplary embodiments, the data for transmission may include, but is not limited to, the following information, which may be sent in the following order: a synchronization sequence, the device ID 574, the latitude coordinate of tag 550, the longitude coordinate of the tag 550, a data string if desired, and a checksum value. For tracking applications, the data string and checksum value may be omitted. The synchronization sequence may be an 8-bit data sequence, for example 11111101, and may be used for timing synchronization between the tag 550 and the base station 502. As the receiving algorithm, using FFT, may not require phase and frequency offset correction, a simple synchronization sequence can be sufficient to provide the timing reference at the receiving base station 502.

Subsequently, at step 714, the Morse-coded device ID may be transmitted at $f_{lat}$, which may be upconverted to the 2.4-2.5 GHZ ISM band. At step 716, the Morse-coded device ID may be transmitted at $f_{lon}$, which may be upconverted to the 2.4-2.5 GHZ ISM band. The duration of the transmission of the Morse-coded device ID may be, for example, about 2.0 seconds; however any other desired duration may also be used. Additionally, a delay of about 1.0 seconds may be provided between the transmission of the second beacon signal and the transmission of the device ID at $f_{lat}$, as well as between the transmission of the device ID at $f_{lat}$ and the transmission of the device ID at $f_{lon}$; however, any other desired delay duration may also be used.

Upon completion of step 716, method 700 may return to step 704 and may repeat for any desired number of cycles, or until transmit mode is deactivated.

The ping/mustering mode provides a way for a base station 502 to initiate communications with one or more remote tags 550. The ping/mustering mode may be initiated by a signal from base station 502 having a strength that exceeds a predetermined RSSI threshold. The base station 502 can transmit this signal to all tags 550 in a desired area. The data transmitted in the signal may differ based on whether a ping or a muster operation is desired.

In a ping operation, the base station 502 may attempt to determine the coordinates of a single remote tag 550. The data transmitted from the base station may be the device ID of the particular single remote tag. The tag 550 having a device ID matching the device ID that was transmitted in the signal can then transmit its location to base station 502.

In a muster operation, the base station 502 may attempt to determine the coordinates of all remote tags 550 in a desired area. The data transmitted from the base station may be the mustering code that is common to a plurality of tags 550. Each tag 550 having a mustering code matching the mustering code that was transmitted in the signal can then transmit its location to base station 502.

Additionally, the ping and mustering operations may be utilized as an additional safety measure. For example, in an emergency event, a user may be located on land, thereby preventing the activation of the tracking mode by the water sensor 568. The user may also be incapacitated or otherwise unable to manually operate the user-operable transmit switch 566. Thus, a base station 502 may ping a particular tag 550 so as to determine the location thereof, or may muster all tags 550 to determine the locations thereof. Furthermore, information as to the locations of all tags 550 may be analyzed by intelligent routing algorithms, for example to determine the most efficient routes and tactics for rescue operations, the use of which may be critical in situations having a large number of users scattered over a large area.

Figure 8:
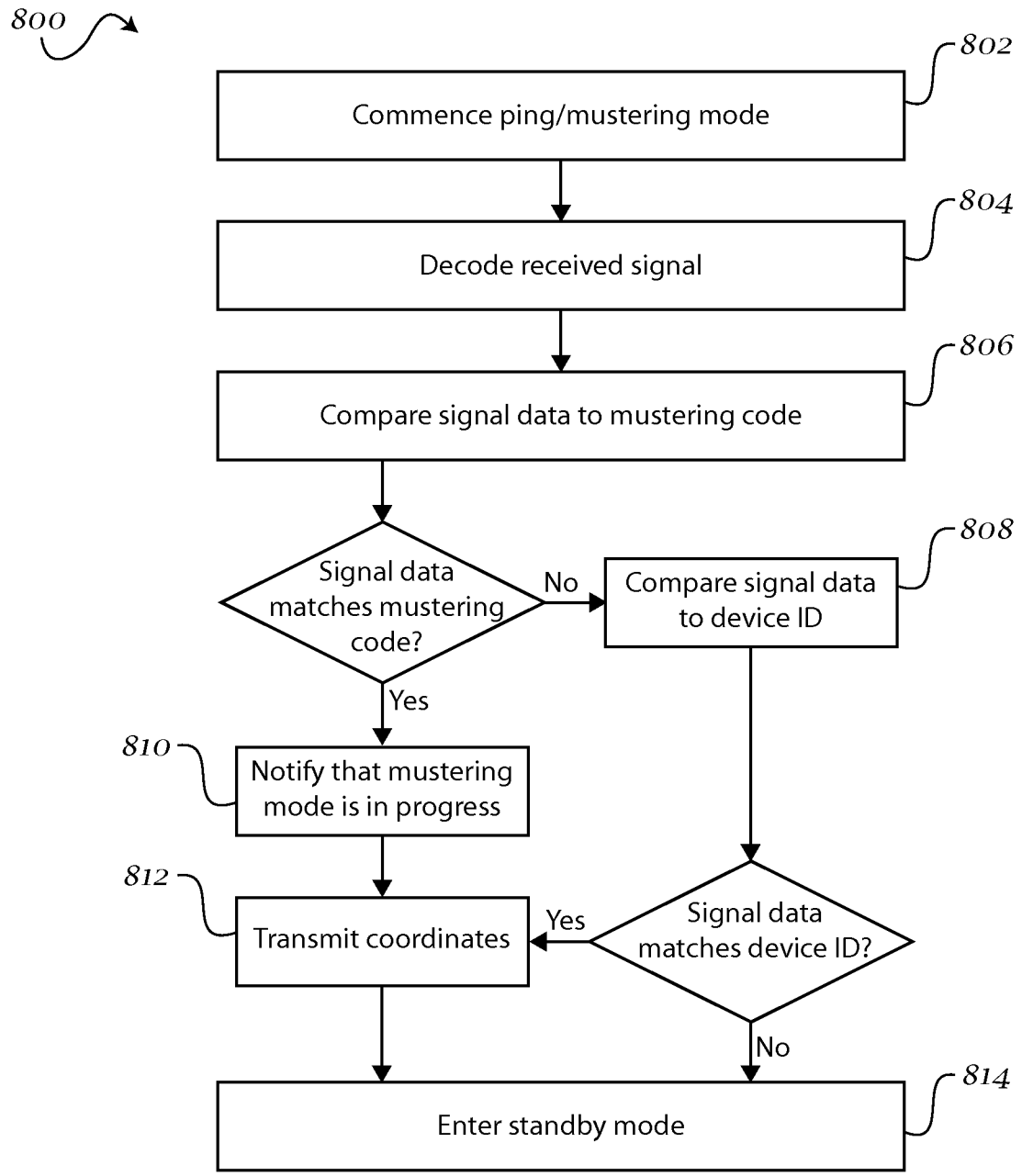
FIG. 8 shows an exemplary ping/mustering mode method for a remote transceiving tag.

FIG. 8 illustrates an exemplary ping/mustering mode method 800. At step 802, ping/mustering mode may be commenced, for example by reception of a signal exceeding a predetermined RSSI threshold. The signal may be a Morse-coded signal containing a device ID or a mustering code. At step 804, the signal may be decoded, so as to determine the for synchronization sequence as well as to determine the data received via the signal.

At step 806, the received data may be compared with the mustering code 576 of the tag 550. If the received data matches the mustering code 576, mustering mode may be commenced. At step 810, a notification indicating that mustering mode is in progress may be issued, for example by activation of beacon 570 and/or buzzer 572 of tag 550. Subsequently, at step 812, the coordinates of tag 550 may be transmitted to base station 502. The transmission of coordinates at step 812 may be performed by executing steps 704-714 of method 700. Upon completion of step 812, standby mode may be entered, at step 814.

If the received data does not match mustering code 576, the received data may be compared, at step 808, to the unique device ID 574 of the tag 550. If the received data matches the device ID 574, ping mode may be commenced. Subsequently, at step 812, the coordinates of tag 550 may be transmitted to base station 502 by executing steps 704-714 of method 700.

If the received data does not match either the mustering code 576 or the unique device ID 574, standby mode may be entered, at step 814, without any further action.

While the foregoing embodiments were described in the context of an emergency rescue operation, it is envisioned that the embodiments described herein may be used in any situation where location and tracking of multiple assets or personnel within an area is desired. Such applications may include maritime domain awareness, real time location awareness, machine to machine communication, asset tracking, and so forth. Therefore, the embodiments described herein should not be construed as limited solely to a particular application.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A method for wirelessly transmitting geographic coordinate information, comprising:
   obtaining a latitude coordinate and a longitude coordinate;
   correlating a first radio frequency to the latitude coordinate;
   correlating a second radio frequency to the longitude coordinate;
   transmitting a signal at the first radio frequency; and
   transmitting a signal at the second radio frequency.

2. The method of claim 1, further comprising:
   obtaining elevation information;
   correlating a third radio frequency to the elevation information; and
   transmitting a signal at the third radio frequency.

3. The method of claim 1, wherein correlating a first radio frequency further comprises adding a first integer to the latitude coordinate so as to obtain a first frequency value, wherein the value of the first integer is determined based on whether the latitude coordinate is located north of the equator or south of the equator.

4. The method of claim 1, wherein correlating a second radio frequency further comprises adding a second integer to the longitude coordinate so as to obtain a second frequency value, wherein the value of the second integer is determined based on whether the longitude coordinate is located east of the prime meridian or west of the prime meridian.

5. The method of claim 2, wherein correlating a third radio frequency further comprises adding a third integer to the elevation information.

6. The method of claim 1, wherein:
   latitude coordinates north of the equator are correlated with radio frequencies in the range between approximately 10.000000 MHz to 18.999999 MHz;

latitude coordinates south of the equator are correlated with radio frequencies in the range between approximately 20.000000 MHz to 28.999999 MHz;

longitude coordinates east of the prime meridian are correlated with radio frequencies in the range between approximately 300.000000 MHz to 317.999999 MHz; and longitude coordinates west of the prime meridian are correlated with radio frequencies in the range between approximately 400.000000 MHz to 417.999999 MHz.

7. A method for wirelessly transmitting geographic coordinate information, comprising:

obtaining a latitude coordinate and a longitude coordinate;

correlating a first radio frequency to the latitude coordinate;

correlating a second radio frequency to the longitude coordinate;

upconverting the first radio frequency to a third radio frequency;

upconverting the second radio frequency to a fourth radio frequency;

transmitting a signal at the third radio frequency; and transmitting a signal at the fourth radio frequency.

8. The method of claim 7, wherein correlating a first radio frequency further comprises adding a first integer to the latitude coordinate so as to obtain a first frequency value, wherein the value of the first integer is determined based on whether the latitude coordinate is located north of the equator or south of the equator.

9. The method of claim 7, wherein correlating a second radio frequency further comprises adding a second integer to the longitude coordinate so as to obtain a second frequency value, wherein the value of the second integer is determined based on whether the longitude coordinate is located east of the prime meridian or west of the prime meridian.

10. The method of claim 7, wherein the third radio frequency and the fourth radio frequency are within the 2.4 GHz-2.5 GHz ISM band.

* * * * *